United States Patent [19]
Blackwell et al.

[11] Patent Number: 5,766,499
[45] Date of Patent: Jun. 16, 1998

[54] METHOD OF MAKING A CIRCUITIZED SUBSTRATE

[75] Inventors: Kim Joseph Blackwell, Owego; Daniel Peter Labzentis, Endicott; Jonathan David Reid, Johnson City, all of N.Y.

[73] Assignee: International Business Machines Corporation, Armonk, N.Y.

[21] Appl. No.: 638,251

[22] Filed: Apr. 26, 1996

[51] Int. Cl.$^6$ .................................................. H01L 21/02
[52] U.S. Cl. ...................... 216/96; 216/105; 438/694; 438/703; 438/754
[58] Field of Search ................ 216/96, 105; 437/228, 437/235, 245; 438/694, 703, 754

[56] References Cited

U.S. PATENT DOCUMENTS

| | | | |
|---|---|---|---|
| 3,627,902 | 12/1971 | Meyers et al. | 174/68.5 |
| 4,472,238 | 9/1984 | Johnson | 156/643 |
| 4,517,050 | 5/1985 | Johnson et al. | 156/643 |
| 4,581,301 | 4/1986 | Michaelson | 428/551 |
| 4,585,528 | 4/1986 | Matsumoto | 204/15 |
| 4,605,471 | 8/1986 | Mitchell | 156/645 |
| 4,610,756 | 9/1986 | Strobel | 156/645 |
| 4,661,654 | 4/1987 | Strobel | 174/68.5 |
| 4,664,962 | 5/1987 | DesMarais, Jr. | 428/137 |
| 4,872,934 | 10/1989 | Kameda | 156/250 |
| 4,889,584 | 12/1989 | Wada et al. | 156/630 |
| 5,218,761 | 6/1993 | Maniwa et al. | 29/852 |
| 5,306,874 | 4/1994 | Biron | 174/262 |
| 5,361,491 | 11/1994 | Oomachi et al. | 29/852 |
| 5,489,749 | 2/1996 | DiStefano et al. | 174/261 |
| 5,599,747 | 2/1997 | Bhatt et al. | 437/209 |

*Primary Examiner*—Mark Chapman
*Attorney, Agent, or Firm*—Pollock, Vande Sande & Priddy

[57] ABSTRACT

A method of making a circuitized substrate wherein a dielectric layer is provided having a first layer of metallic material thereon. A first metallic member is formed on the dielectric's metallic layer, following which a pair of openings are precisely provided within a second dielectric material located on the dielectric. These openings in turn define a selected area on the first metallic member and, significantly, a precisely oriented pattern of the first metallic layer at a spaced distance from the metallic member. This metallic pattern serves as a mask to permit formation of an opening through the dielectric, which opening in turn may be engaged by tooling or the like such as may be used to position an electronic component, e.g., semiconductor device, on the underlying substrate. The invention thus assures precise orientation and placement of components such as semiconductor devices on highly dense circuit patterns such as those required in the present art in the manufacture of devices such as those of the information handling system (computer) variety.

31 Claims, 7 Drawing Sheets

METHOD OF MAKING A CIRCUITIZED SUBSTRATE

TECHNICAL FIELD

This invention relates to methods of making circuitized substrates for use in such products as information handling systems (e.g., computers). Although not limited thereto, the invention relates particularly to the manufacture of such substrates of the flexible type.

BACKGROUND OF THE INVENTION

Circuitized substrates, including flexible circuits and those of the more rigid variety (called printed circuit cards or boards in the industry), are well known as are several methods for making same. Examples are shown and described in U.S. Pat. Nos. 5,489,749 (DiStefano et al), 4,664,962 (DesMarais, Jr.), 4,517,050 (Johnson et al), 4,472,238 (Johnson) and 3,627,902 (Bergman et al). Other substrates and methods of making same are shown and described in U.S. Pat. Nos. 5,361,491 (Oomachi et al), 5,306,874 (Biron), 5,218,761 (Ohnuki), 4,889,584 (Wada et al), 4,872,934 (Kameda), 4,661,654 (Strobel), 4,610,756 (Strobel), 4,605,471 (Mitchell), 4,581,301 (Michaelson) and 4,585,528 (Matsumoto).

In U.S. Pat. No. 5,489,749, there is described a method of attaching a semiconductor chip to bridging leads of a substrate wherein the leads include a frangible section which enables the leads to be broken at this section during bonding to the chip's contact sites. A bonding tool is required for final lead-chip site alignment. A copper layer is removed after plating the substrate's through hole.

In U.S. Pat. No. 4,664,962, a printed circuit board is described which includes a laminate bonded thereto and forming part thereof. The laminate includes a polymeric support, adhesive intermediate stratum and an electrical conductor layer of copper. Masking of selected holes in the structure is accomplished using photoresist. A metal "collar" is also formed.

In U.S. Pat. No. 4,517,050, a conductor layer is used to define an opening in a substrate, the opening then being etched and the layer then deformed at the undercut portion thereof to protrude downwardly into the opening. The protrusion serves to provide interconnection between two opposed layers of conductor, with the substrate then forming a printed circuit board. U.S. Pat. No. 4,472,238 is substantially similar in that conductor deformation is required to form an interconnection between opposing layers.

U.S. Pat. No. 3,627,902 describes and illustrates the formation of a conductive through hole in a multilayered printed circuit board structure in which an internal conductive "shoulder" is formed and a hole then drilled through the board and "shoulder". Conductive metal is then applied to the hole to thereby provide a conductive path from the board's outer conductive surfaces to the internal conductor layer having the "shoulder" as part thereof A more reliable connection is alleged using this procedure.

In the production of circuitized substrates of the type described herein, and particularly those of the thin, flexible type, it is important that tooling openings be provided in the substrate relative to the substrate's circuitry for alignment purposes. One primary example of such alignment is that needed to assure proper positioning of a semiconductor chip onto precise conductor locations, e.g., a pad or a plurality of conductive circuit paths terminating in a patterned array of conductors, designed for being coupled to respective sites on the chip. During such alignment, the chip-holding tool engages an opening in the substrate, and, based on such engagement, then functions to deposit the chip onto adjacent circuitry whereupon a connection, e.g., using solder, can be formed. The tolerances between such openings and associated circuitry are often approximately only one-thousandths of an inch (one mil). Understandably, if even the slightest misalignment occurs under such constraints, improper connections between the highly dense pattern of chip sites and substrate's conductors may occur, resulting in a defective product.

In one process for providing substrate openings and aligning circuitry, it is necessary to utilize two separate photolithography procedures such that location accuracy must be maintained during both procedures, which is understandably difficult and time-consuming.

In accordance with the teachings of the invention, there is provided a method of making a circuitized substrate such as a thin, flexible circuit wherein a "sacrificial" metal member is formed simultaneously with formation of the substrate's other circuit elements whereupon this member can then be used to precisely define an opening within the substrate. Thus, this sacrificial member is used as a mask which can then be readily removed from the structure following opening formation. The method as defined herein can be accomplished expediently, yet in a manner which assures the high precision demanded from such products.

It is believed that such a method would constitute a significant advancement in the art.

DISCLOSURE OF THE INVENTION

It is a primary object of the invention to enhance the art of manufacturing circuitized substrates such as printed circuit boards and particularly thin, flexible circuitized substrates.

It is another object of the invention to provide a method of making a circuitized substrate wherein extremely tight tolerances can be maintained between the substrate's circuitry and openings provided in the substrate, e.g., for tooling engagement.

It is still another object of the invention to provide such a method which can be accomplished in a facile and relatively inexpensive manner without the need for additional, unnecessary processing steps or relatively complex manufacturing apparatus.

It is a still further object of the invention to provide such a method which can be performed using apparatus and processing materials commonly known and used in the substrate manufacturing art.

In accordance with one embodiment of the invention, there is provided a method of making a circuitized substrate wherein a first layer of dielectric material is provided, a first layer of metallic material is provided on the dielectric layer, a first metallic member is provided at a first location on the metallic material's surface, a second layer of dielectric material is provided onto the first layer of metallic material and a plurality of openings are provided within the second layer of dielectric to expose part of the metallic member and a precisely distanced portion of the first layer of metallic material in the form of a closed pattern substantially surrounding a defined segment of the second dielectric. At least part of the first metallic layer is removed, a second layer of metallic material is provided onto the remaining part of the first layer of metallic material of the exposed portion of the closed pattern, the second layer of dielectric is removed and substantially all of the first layer of metallic material under the defined segment is removed to expose a precise area on the first dielectric. The precise area of dielectric is used as a mask to enable provision of an opening in the first dielectric, and the second layer of metallic material on the exposed portion of the closed pattern is removed. The result is a layered substrate having at least one conductor thereon and at least one opening precisely oriented from the conductor, e.g., to facilitate subsequent processing steps such as semiconductor chip alignment and placement.

For a better understanding of the present invention, together with other and further objects, advantages and capabilities thereof, reference is made to the following disclosure and appended claims in connection with the above-described drawings. It is understood that like numerals will be used from FIG. to FIG. to identify similar elements. It is also understood that the various elements of the invention as illustrated herein are not necessarily to scale and in fact may be exaggerated in size for enhancing illustration and description thereof.

Figure 1:
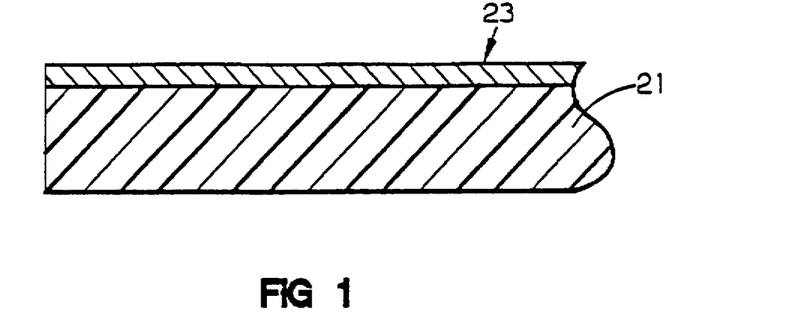
FIGS. 1–16 represent the steps of a method for making a circuitized substrate in accordance with one embodiment of the invention.

In FIG. 1, there is shown a first layer 21 of dielectric material having a first layer 23 of metallic material thereon. In one embodiment, layer 21 was comprised of polyimide and possessed a thickness of only about 0.001 inch. Layer 23 was preferably comprised of chromium and copper and, in the same embodiment, possessed a thickness of only about $1.6 \times 10^{-5}$ inch. Layer 23 is preferably provided on layer 21 using a vacuum deposition sputtering operation in which a first, extremely thin (e.g., $8 \times 10^{-7}$ inch) layer of chromium is provided following which another extremely thin (e.g., $1.6 \times 10^{-5}$ inch) layer of copper is added thereto, thus resulting in the singular layer 23 of the thickness defined. Other methods known in the art may be utilized to position metallic layer 23 on the underlying dielectric material, including, e.g., lamination. Vacuum sputter deposition is a known procedure in the art and further description is not believed necessary.

Figure 2:
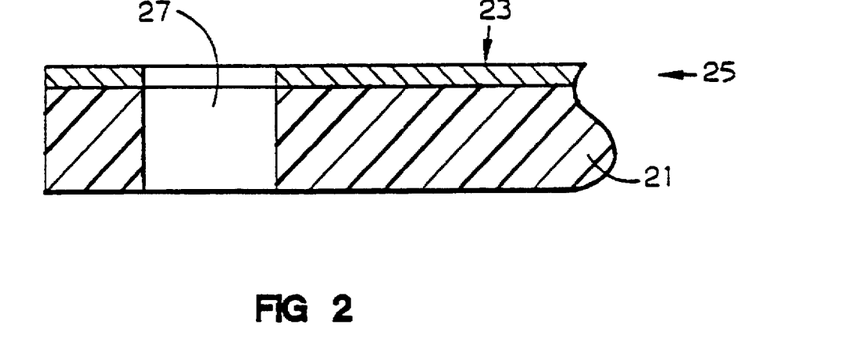

In FIG. 2, the layered structure 25 (comprised of layers 21 and 23) has been punched to provide a hole 27 therethrough. In one embodiment, hole 27 was preferably cylindrical and possessed a diameter of about 0.060 inch. During the manufacture of substrates of the type defined herein, several such holes may be provided, including by means other than mechanical punching, e.g., etching. Such holes are termed registration holes and are utilized, in one embodiment of the invention, for properly registering glass masters used in the photolithography steps forming the eventual circuitry of the invention. It is understood, however, that this operation (providing a hole) is not an essential step of the present invention and such a step should not, therefore, restrict the scope of the invention as defined herein.

Figure 3:
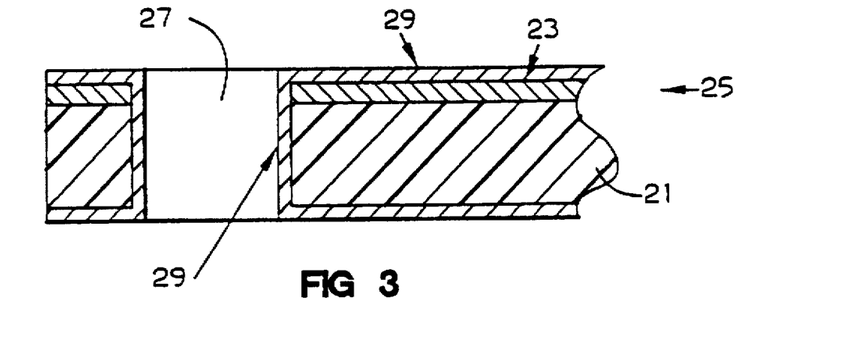

In FIG. 3, another optional step is shown as being provided for the structure 25, this being the further deposition (preferably using a vacuum sputter deposition process as described in FIG. 1 above) to deposit another relatively thin metallic layer onto the first layer 23 and the internal walls of hole 27. This second metallic layer is represented by the numeral 29 in FIG. 3. This additional metallic material is desired on the internal walls of hole 27 for the purpose of providing electrical continuity between metal circuitry features on opposite sides of layer 21.

Figure 4:
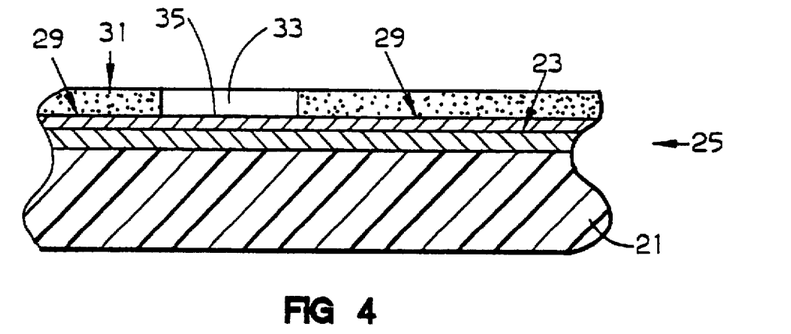
Figure 5:
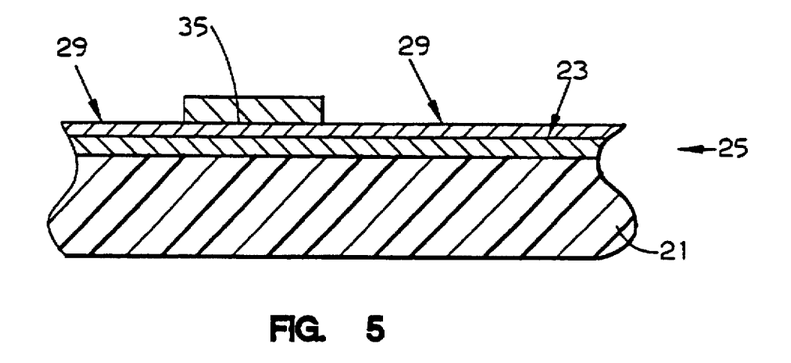

In FIG. 4, a layer 31 of photoresist is applied to the upper conductive layer 29 and a predetermined portion thereof exposed, developed and removed to define an opening 33 within the photoresist. (Note: hole 27 is not seen in FIG. 4, or the following FIGS.) Preferably, photoresist 31 is sold under the brand name "CFI Photoresist" and is available from MacDermid Imaging Technology, Inc., Wilmington, Del. and is applied in film form onto structure 25. Thin film resists of the type described above, as well as the various processes for applying such materials to substrates such as those described herein, are known in the art and further description is not believed necessary. Also known are the various photolithography steps used to expose, develop and remove selected portions of such resists so as to expose an underlying surface. In FIG. 4, such a surface is represented by the numeral 35. Structure 25, having the defined opening 33 therein, is then subjected to an electroplating operation during which a relatively thick (e.g., 0.001 inch) metallic layer 41 is provided, using the photoresist 31 as a mask. Layer 41 is preferably copper or alloys thereof and thus represents a first metallic member positioned on the upper surface 35. In one example, the metallic member 41 was of substantially cylindrical configuration and possessed a diameter of about 0.016 inch. Following plating of member 41, the remaining photoresist 31 is easily removed using an aqueous strip process. The resulting structure is shown in FIG. 5.

Figure 6:
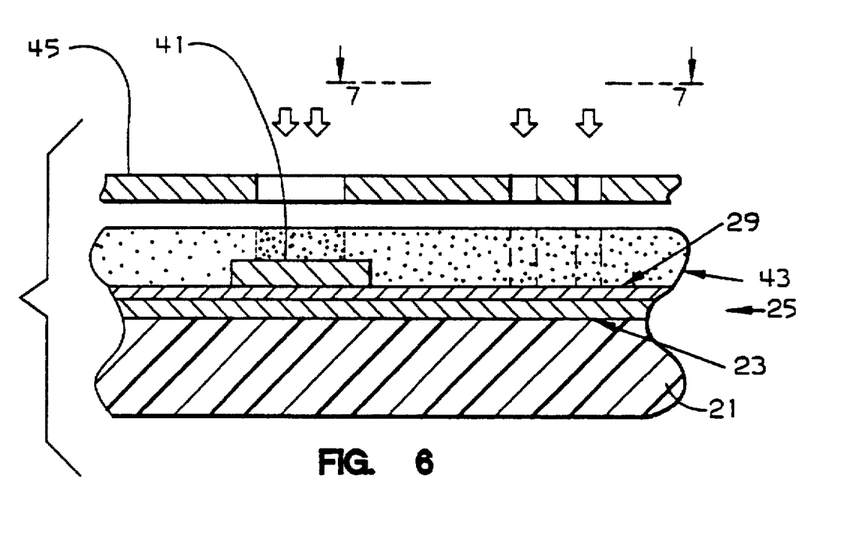
Figure 7:
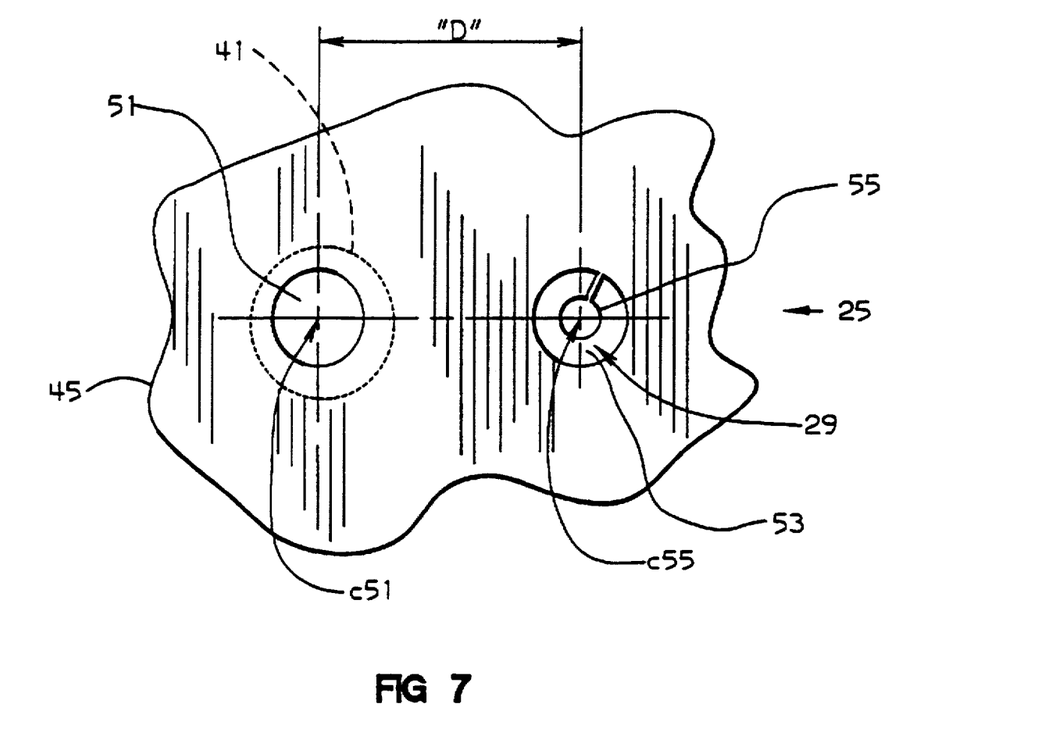

In FIG. 6, there is shown an extremely significant aspect of the present invention. Specifically, a second layer of photoresist 43 (preferably also of the thin film variety and of the same material as photoresist 31 above) is applied onto structure 25 to substantially cover both member 41 and the exposed surfaces of layer 29 (or, layer 23, if layer 29 is not used). The photoresist is also applied in thin film format. Following such application, a mask 45 is precisely aligned relative to structure 25 to, significantly, precisely expose both a selected area of the photoresist atop member 41 and, significantly, an adjacent portion of the photoresist located above the surface of the underlying metallic layer 29 in the form of a substantially closed pattern. This will be explained in greater detail hereinbelow. Most importantly, the use of a photolithography step at this phase of the invention assures precise exposure of the photoresist 43 so as to assure exact positioning between the exposed photoresist above member 41 and the associated areas above the metallic layer 29. (Again it should be mentioned that layer 29 represents an optional step which, if not provided, would still leave the defined layer 23 directly exposed.) Following exposure (the enlarged arrows in FIG. 6 depicting the light used to expose the photoresist 43 under mask 45) the exposed areas of photoresist 43 are developed and removed. The result, as shown in FIG. 7, is a substantially cylindrical area 51 of the metallic member 41 and an adjacent, substantially closed pattern 53 adjacent thereto. The substantially closed pattern 53 exposing the underlying metallic material is, similarly to opening 51, substantially cylindrical in shape but, significantly, defines a central segment 55 of photoresist material 43 remaining therein. In FIG. 7, both cylindrical shapes are axially positioned about 0.05 to about 0.25 inches apart (dimension "D" in FIG. 7). The respective axes are referenced by C51 and C55 in FIG. 7.

Figure 8:
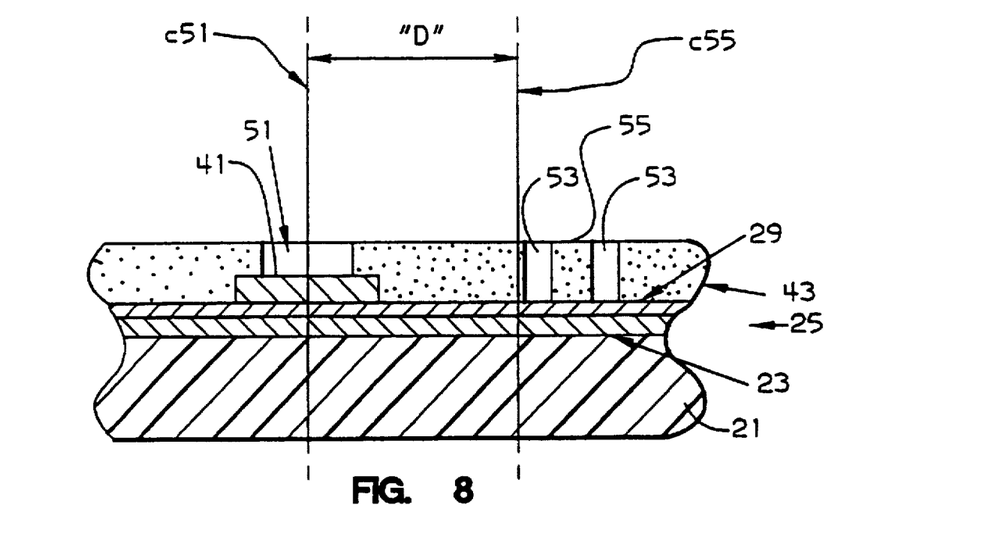

FIG. 8 represents a side, elevational view, in section of the embodiment of FIG. 7. For reasons understood by the foregoing, it is not necessary to precisely orient the opening within photoresist 43 which exposes the selected area 51 on member 41 at the exact center of member 41. That is, the cylindrical area 51 does not need to be concentric relative to the center of the underlying cylindrical member 41. As defined herein, it is only necessary that the resulting substantially closed pattern 53 be precisely oriented relative to member 41 such that at least part of the member 41 is exposed. Significantly, using such photolithography steps, it is possible to maintain tolerances for dimension "D" within the range of from only about 0.00005 to about 0.0001 inches, which tolerances are deemed critical when considering the dimensional constraints for the various circuit elements (e.g., lines and pads) for the present invention. In one embodiment, the substantially closed pattern, of substantially cylindrical shape, possessed an outer diameter of only about 0.008 inch while the corresponding outer diameter for the also cylindrical opening which defines area 51 of member 41 was about 0.003 inch. Significantly, the centrally located, also substantially cylindrical segment 55 possessed an outer diameter of only about 0.020 inch. Segment 55, being so located, is thus precisely oriented with respect to the center (C51) of the adjacent cylindrical opening for metallic member 41. C55 also represents the center for segment 55.

Figure 9:
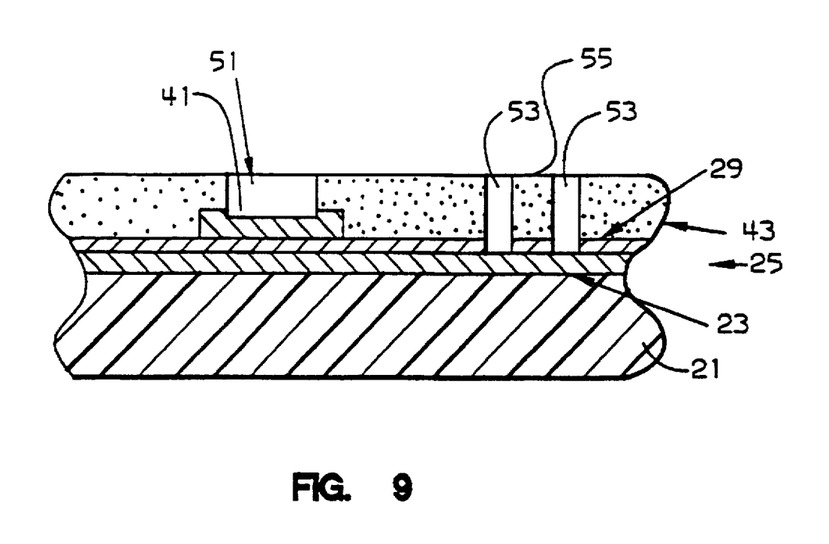

In FIG. 9, structure 25 is shown as being subjected to an etching step wherein a predetermined amount of the exposed metallic surfaces defined by the above cylindrical openings is removed. In one embodiment, structure 25 was subjected to a flash etch operation in which an etchant, e.g., sodium persulfate, was used. The etchant served to remove portions of copper metallic member 41 to a depth of only about 0.0001 inch. (This is greatly exaggerated in FIG. 9.) Additionally, the etchant substantially removed the copper portion of the first metallic layer 23, leaving only the aforedefined thin chromium metal on dielectric 21. (As seen in FIG. 9, if the additional metallic layer 29 is used, this layer is also removed.) Selective removal was attained by exposing structure 25 to the etchant for a period of about two minutes at a temperature of about thirty degrees C. This removal step was thus used with materials and apparatus known in the art, and further description is not believed necessary.

Figure 10:
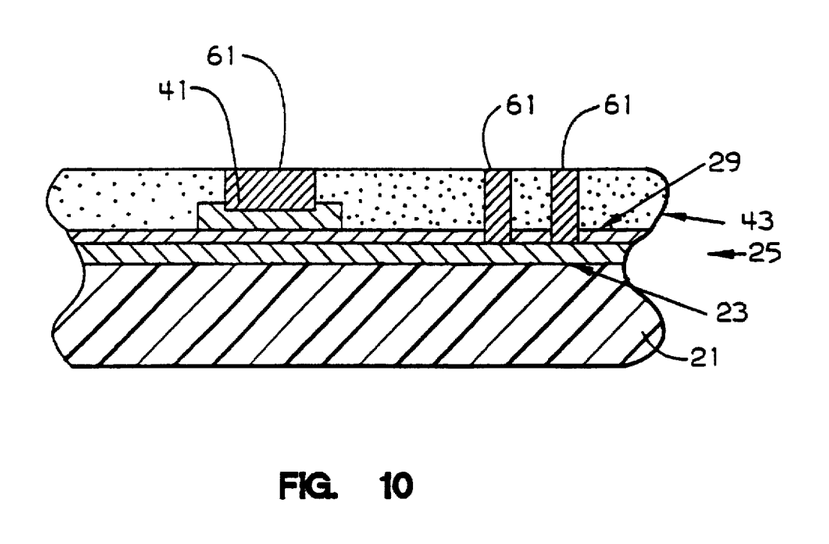

Following the above metal removal, a second layer 61 of metallic material is applied to structure 25. As seen in FIG. 10, this second layer 61 substantially fills the openings above metallic member 41 and the partially removed metallic layer 23. Layer 61 is preferably copper and is provided using an electroplating operation in which copper is deposited onto the circuitized substrate from a solution containing copper ions and a conducting electrolyte.

In one embodiment, layer 61 possessed a thickness of about 0.002 inch. (The relative thicknesses shown in the drawings are for illustration purposes only and are not necessarily to scale.)

Figure 11:
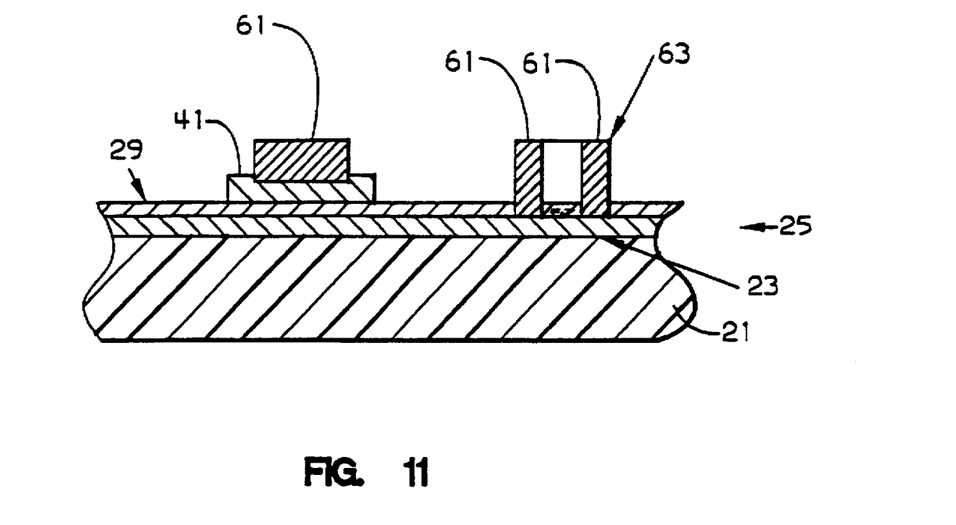

In FIG. 11, photoresist 43 has been removed (using standard procedures such as described above for the removal of photoresist 31) to leave the plated metallic member 41 and adjacent, substantially cylindrical "donut", now referenced by the numeral 63. Significantly, metallic member 41 is positioned on both the underlying metallic layers 23 and 29 (again, if 29 is used) while the adjacent "donut" 63 is only positioned on the remnants (e.g., chromium) of layer 23. This represents a critical feature of the invention as understood from the following.

Figure 12:
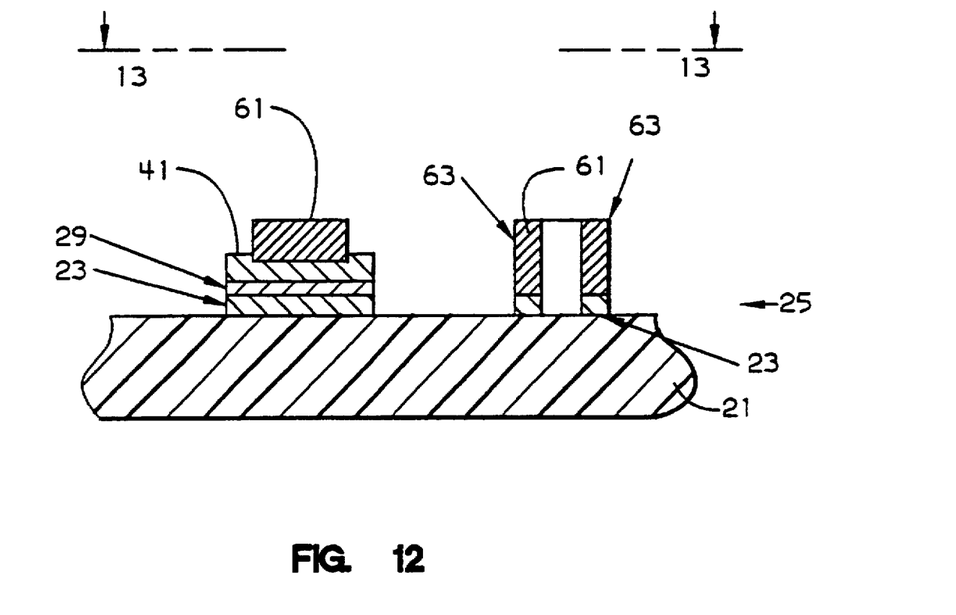

In FIG. 12, structure 25 is subjected to an etching operation wherein the exposed portions of the underlying metallic layers 23 and 29 are removed from the upper surface of dielectric 21.

Figure 13:
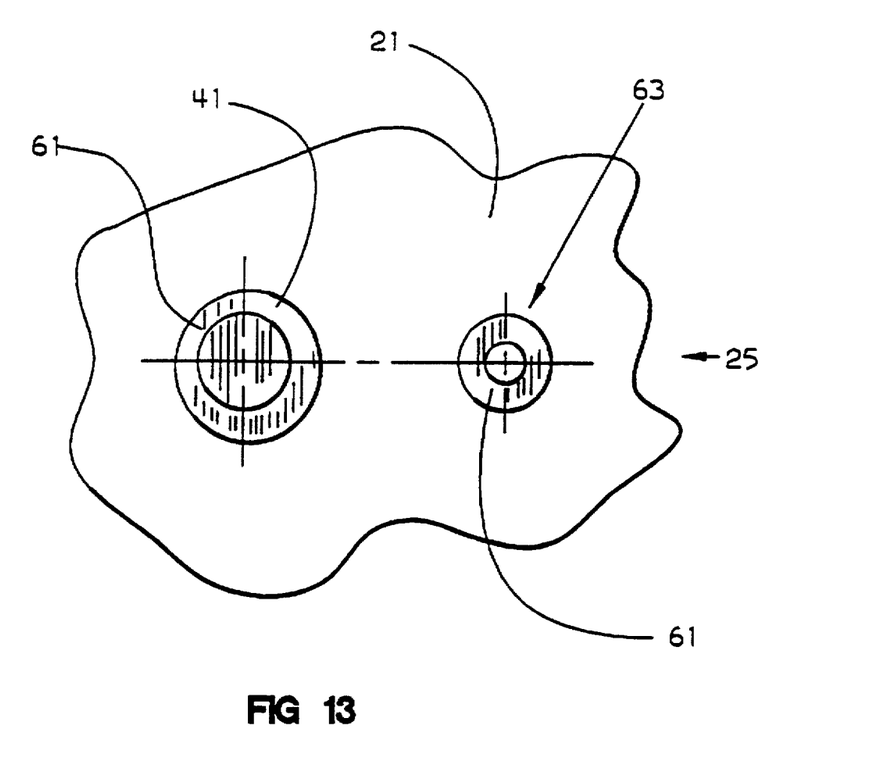

FIG. 13, taken along the line 13—13 in FIG. 12, is a plan view of the metallic members 41 and 63 remaining on the upper surface of dielectric 21. It is again worth mentioning that the layer element 61 located atop the underlying metallic member 41 is not necessarily concentrically oriented on member 41, it only being necessary for purposes of the invention that this covering layer occupy a part of the member 41's top surface.

Figure 14:
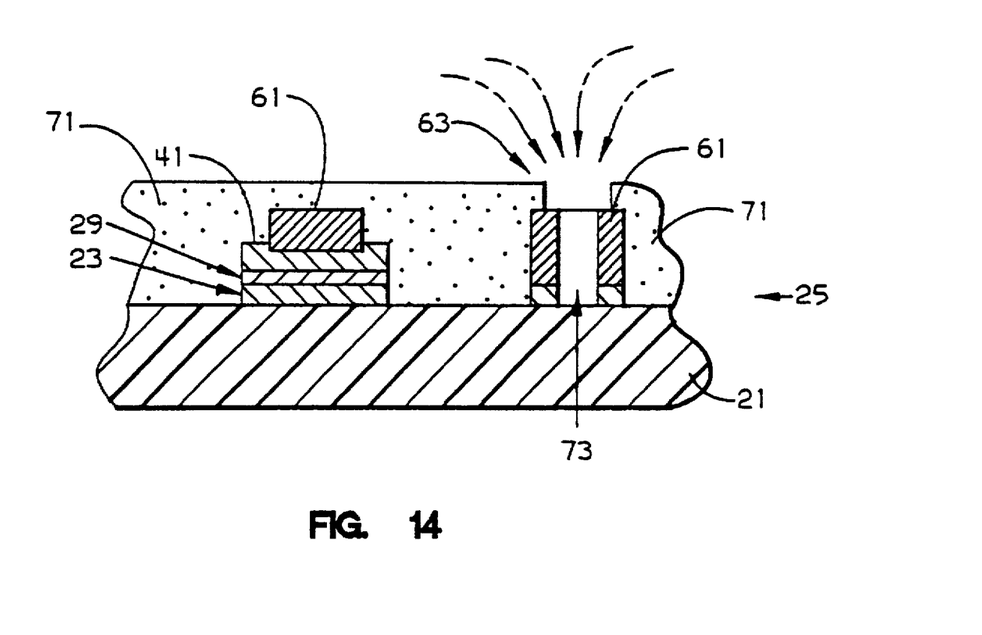
Figure 15:
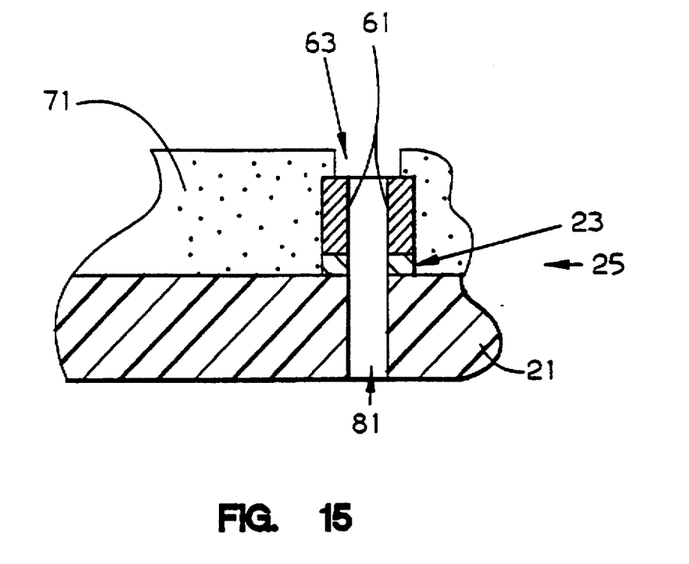

In FIG. 14, a third layer 71 of photoresist is added to substantially cover members 41 and 63, excluding, significantly, the central opening 73 of member 63. Thus, photoresist 71 does not enter member 63 to cover the exposed undersurface of dielectric 21 as defined by the substantially closed pattern of member 63. In one embodiment of the invention, photoresist 71 is available under the product name "Riston 330R" photoresist, available from E. I. duPont deNemours & Company, Wilmington, Del. Preferably, this material is applied in dry film form to substantially assume the configuration depicted in FIG. 14 (and FIG. 15). Structure 25 is then subjected to a polyimide etchant (represented by the dashed arrows in FIG. 14) which penetrates member 63 to etch a precisely defined opening 81 through the underlying dielectric 21. Opening 81, as shown in FIG. 15, extends through dielectric 21 and, because of the location of member 63, is defined by this member such that member 63 functions as a mask. Member 41 is not shown in the enlarged view of FIG. 15. A preferred polyimide for use in the step shown in FIG. 15 is available in film format under the product name "Kapton E" or "Kapton H" from duPont. Other etchants of this type are known in the art and further description is not necessary.

Figure 16:
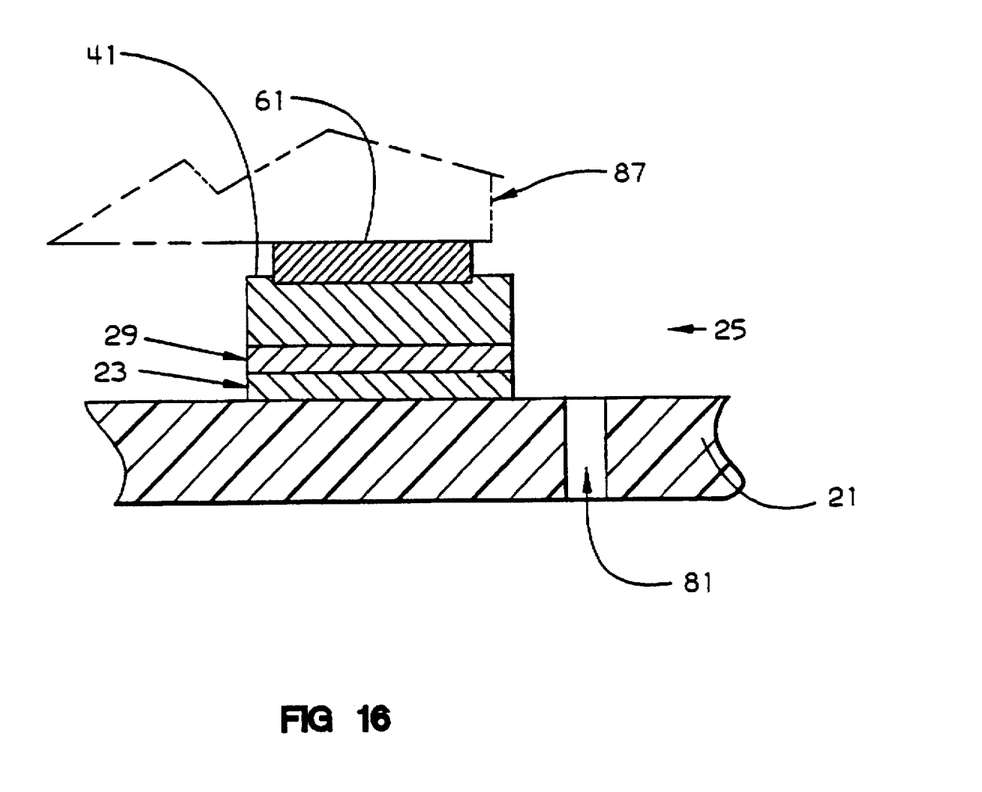

Following formation of opening 81, the photoresist material 71 is removed to leave the structure as shown in FIG. 16. Specifically, structure 25 in FIG. 16 includes the dielectric layer 21 with the metallic member 41 and its associated metal coating 61 positioned adjacent opening 81. Specifically, member 41, as stated, is positioned on the two underlying metallic layers 23 and 29 (again, only 23 is necessary). This is substantially different from the aforedescribed positioning of member 63 which, as stated, was only positioned on the remaining portion (e.g., chromium) of layer 23. As a result of these two different underlying metallic surfaces, the member 41 possesses a substantially greater level of adhesion on substrate 21 than member 63 which thus facilitates removal of the "sacrificial" member 63. Such removal, in one embodiment of the invention, was attainable using spray rinses (e.g., deionized water) operating at a pressure level of between only about ten pounds per square inch (p.s.i.) and 30 p.s.i. Member 63 is thus mechanically removed using a relatively simple rinsing operation while assuring that member 41 remains in position. Member 63 removal is also possible by other mechanical means, including utilization of a rotating brush or the like to apply the necessary mechanical force.

Following formation of structure 25 as shown in FIG. 16, the structure may now be subjected to a chip placement operation in which the semiconductor chip which is used as part of such an electronic package using the substrate shown by structure 25 forms part thereof. The precisely oriented opening 81 thus allows for engagement by a tooling member or the like of structure 25 such that this tooling may then precisely orient the semiconductor chip on metallic member 41. Actually, the chip engages the upper surface of the metallic layer 61, if present. One example of a chip is depicted in phantom in FIG. 16 and referenced by the numeral 87. Further description of such known semiconductor devices should not be necessary. Significantly, the use of one or more tooling openings 81 assures precise alignment of additional electronic structures such as semiconductor chips on the circuitry of structure 25. By way of another example, member 41 could represent a part of a pattern of several such members each corresponding to a respective one of the chip's contact sites such that precise placement of these contact sites on respective ones of the members 41 can be effectively accomplished. As stated above, even slight misalignment at this stage may result in an inoperative end product. The method taught herein substantially prevents such misalignment.

Thus there has been shown and described a method of making a circuitized substrate wherein precise orientation of openings such as those designated for receiving tooling structures or the like may be precisely oriented relative to remaining parts (circuit lines and/or pads) of the structure's circuitry. While the invention has been described with respect to positioning a semiconductor chip, it is well within the scope of the invention to position other structures, e.g., resistors, capacitors, etc., using the teachings herein.

Although the invention has taught provision of a removable metallic element used for the purpose of previously defining an exposed segment of the structure's underlying metallic layer (relative to the first metallic member), the invention is not so limited in that it can also be used to provide a removable metallic element capable of other purposes in the structure. One example is a commoning bar subsequently used for electrical testing, etc., of the structure, following which the bar is desirably removed.

While there has been shown and described what are at present considered the preferred embodiments of the invention, it will be obvious to those skilled in the art that various changes and modifications may be made therein without departing from the scope of the invention as defined by the appended claims.

We claim:

1. A method of making a circuitized substrate, said method comprising:

providing a first layer of dielectric material;

providing a first layer of metallic material on said layer of dielectric material;

providing a first metallic member at a first location on said first layer of metallic material;

providing a second layer of dielectric material onto said first layer of metallic material and at least part of said first metallic member;

forming a plurality of openings within said second layer of dielectric material such that a first of said openings exposes at least part of said first metallic member and a second of said openings is precisely oriented relative to said first opening and exposes a portion of said first layer of metallic material in the form of a substantially closed pattern substantially surrounding a defined segment of said second layer of dielectric material;

removing at least part of said first layer of metallic material of said exposed portion of said closed pattern of said first layer of metallic material;

providing a second layer of metallic material onto the remaining part of said first layer of metallic material of said exposed portion of said closed pattern and onto said exposed portion of said metallic member;

removing said second layer of dielectric material;

removing substantially all of said first layer of metallic material covered by said defined segment of said second layer of dielectric material to expose a precise area on said first layer of dielectric material;

providing a device orienting opening precisely located with respect to said first opening by providing an opening within said first layer of dielectric material using said precise area as a mask; and removing said second layer of metallic material on said first layer of metallic material of said exposed portion of said closed pattern.

2. The method of claim 1 wherein said first layer of metallic material is provided on said first layer of dielectric material by sputter deposition.

3. The method of claim 1 wherein said first layer of metallic material is provided by firstly depositing a first metal and thereafter depositing a second metal onto said first metal.

4. The method of claim 3 wherein said first metal is chromium and said second metal is copper.

5. The method of claim 1 wherein said first metallic member is provided by electroplating.

6. The method of claim 5 wherein said first metallic member is copper.

7. The method of claim 1 wherein said second layer of dielectric material is laminated onto said first layer of metallic material.

8. The method of claim 1 wherein said part of said first layer of metallic material is removed by chemical etching.

9. The method of claim 1 wherein said second layer of metallic material is provided by electroplating.

10. The method of claim 9 wherein said second layer of metallic material is copper.

11. The method of claim 1 wherein said second layer of metal in said first layer of metallic material of said exposed portion of said closed pattern is removed using mechanical force.

12. The method of claim 11 wherein said mechanical force is applied by spray rinses operating at between about 10 psi and 30 psi.

13. The method of claim 11 wherein said mechanical force is applied using a rotating brush.

14. The method of claim 1 further including the step of positioning an electrical component on said first metallic member at a predetermined, precise distance from said opening within said first layer of dielectric material.

15. The method of claim 14 wherein said electrical component is a semiconductor device.

16. A method of making a circuitized substrate, said method comprising:

providing a first layer of dielectric material;

providing a first layer of metallic material on said layer of dielectric material;

providing a first metallic member at a first location on said first layer of metallic material;

providing a second layer of dielectric material onto said first layer of metallic material and at least part of said first metallic member;

forming a plurality of openings within said second layer of dielectric material such that a first of said openings exposes at least part of said first metallic member and a second of said openings is precisely oriented relative to said first opening and exposes a portion of said first layer of metallic material in the form of a predetermined pattern substantially surrounding a defined segment of said second layer of dielectric material;

removing at least a part of said first layer of metallic material of said exposed portion of said closed pattern of said first layer of metallic material;

providing a second layer of metallic material onto the remaining part of said first layer of metallic material of said exposed portion of said closed pattern and onto said exposed portion of said metallic member;

removing said second layer of dielectric material;

removing substantially all of said first layer of metallic material covered by said defined segment of said second layer of dielectric material to expose a precise area on said first layer of dielectric material; and providing a device orienting opening precisely located with respect to said first opening by removing said second layer of metallic material on said first layer of metallic material of said exposed portion of said closed pattern.

17. The method of claim 16 wherein said first layer of metallic material is provided on said first layer of dielectric material by sputter deposition.

18. The method of claim 16 wherein said first layer of metallic material is provided by firstly depositing a first metal and thereafter depositing a second metal onto said first metal.

19. The method of claim 18 wherein said first metal is chromium and said second metal is copper.

20. The method of claim 16 wherein said first metallic member is provided by electroplating.

21. The method of claim 20 wherein said first metallic member is copper.

22. The method of claim 16 wherein said second layer of dielectric material is laminated onto said first layer of metallic material.

23. The method of claim 16 wherein said part of said first layer of metallic material is removed by chemical etching.

24. The method of claim 16 wherein said second layer of metallic material is provided by electroplating.

25. The method of claim 24 wherein said second layer of metallic material is copper.

26. The method of claim 16 wherein said second layer of metal in said first layer of metallic material of said exposed portion of said closed pattern is removed using mechanical force.

27. The method of claim 26 wherein said mechanical force is applied by spray rinses operating at between about 10 psi and 30 psi.

28. The method of claim 26 wherein said mechanical force is applied using a rotating brush.

29. The method of claim 16 further including the step of positioning an electrical component on said first metallic member at a predetermined, precise distance from said opening within said first layer of dielectric material.

30. The method of claim 29 wherein said electrical component is a semiconductor device.

31. A method of forming an electronic package including at least a circuitized substrate and at least one device attached to said circuitized substrate, said method comprising the steps of:

providing a first layer of dielectric material;

providing a first layer of metallic material on said layer of dielectric material;

providing a first metallic member at a first location on said first layer of metallic material;

providing a second layer of dielectric material onto said first layer of metallic material and at least part of said first metallic member;

forming a plurality of openings within said second layer of dielectric material such that a first of said openings exposes at least part of said first metallic member and a second of said openings is precisely oriented relative to said first opening and exposes a portion of said first layer of metallic material in the form of a substantially closed pattern substantially surrounding a defined segment of said second layer of dielectric material;

removing at least part of said first layer of metallic material of said exposed portion of said closed pattern of said first layer of metallic material;

providing a second layer of metallic material onto the remaining part of said first layer of metallic material of said exposed portion of said closed pattern and onto said exposed portion of said metallic member;

removing said second layer of dielectric material;

removing substantially all of said first layer of metallic material covered by said defined segment of said second layer of dielectric material to expose a precise area on said first layer of dielectric material;

providing a device orienting opening precisely located with respect to said first opening by providing an opening within said first layer of dielectric material using said precise area as a mask;

removing said second layer of metallic material on said first layer of metallic material of said exposed portion of said closed pattern;

arranging at least a portion of a tool attached to a device to be attached to said circuitized substrate in said device orienting opening; and electrically attaching said device to at least one metallic portion of said circuitized substrate.

\* \* \* \* \*